US010811087B2

(12) United States Patent
Noel et al.

(10) Patent No.: US 10,811,087 B2
(45) Date of Patent: Oct. 20, 2020

(54) MEMORY CIRCUIT CAPABLE OF IMPLEMENTING CALCULATION OPERATIONS

(71) Applicant: Commissariat à l'Énergie Atomique et aux Énergies Alternatives, Paris (FR)

(72) Inventors: Jean-Philippe Noel, Eybens (FR); Bastien Giraud, Voreppe (FR)

(73) Assignee: Commissariat à lÉnergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 16/224,741

(22) Filed: Dec. 18, 2018

(65) Prior Publication Data

US 2019/0189199 A1 Jun. 20, 2019

(30) Foreign Application Priority Data

Dec. 19, 2017 (FR) .................................... 17 62534

(51) Int. Cl.
*G11C 11/419* (2006.01)
*G11C 7/10* (2006.01)
*G11C 11/417* (2006.01)
*G11C 11/412* (2006.01)

(52) U.S. Cl.
CPC .......... *G11C 11/419* (2013.01); *G11C 7/1006* (2013.01); *G11C 11/417* (2013.01); *G11C 11/412* (2013.01)

(58) Field of Classification Search
CPC ... G11C 11/419; G11C 11/417; G11C 11/412; G11C 7/1006; H04N 5/353; H04N 5/378
See application file for complete search history.

(56) References Cited

U.S. PATENT DOCUMENTS

2009/0141537 A1 6/2009 Arsovski
2016/0189769 A1 6/2016 Jeloka et al.
2019/0098232 A1* 3/2019 Mori ...................... H04N 5/378

FOREIGN PATENT DOCUMENTS

EP  3 252 774 A1  12/2017

OTHER PUBLICATIONS

Preliminary Search Report for French Application No. 1762534, dated Oct. 16, 2018.
Can Akyel et al., DRC2: Dynamically Reconfigurable Copmuting Circuit Based on Memory Architecture. 2016 IEEE International Conference on Rebooting Computing. 2016: 8 pages.

* cited by examiner

Primary Examiner — Sultana Begum
(74) Attorney, Agent, or Firm — Wolf, Greenfield & Sacks, P.C.

(57) ABSTRACT

A memory circuit including a plurality of elementary cells arranged in an array of rows and of columns, and a control circuit capable of implementing an operation of vertical reading of a word from a column of the array.

10 Claims, 7 Drawing Sheets

MEMORY CIRCUIT CAPABLE OF IMPLEMENTING CALCULATION OPERATIONS

CROSS-REFERENCE TO RELATED APPLICATIONS

This application claims priority to French patent application number 17/62534, filed on Dec. 19, 2017, which is incorporated herein by reference in its entirety.

BACKGROUND

The present application concerns the field of memory circuits. It more particularly aims at a memory circuit capable of implementing calculation operations.

DISCUSSION OF THE RELATED ART

A memory circuit capable not only of storing data, but also of executing, in situ, during accesses to the memory content, a number of logic and/or arithmetic operations having as operands data stored in the circuit, has already been provided in French patent application No 16/54623 filed by the applicant on May 24, 2016. This circuit comprises, as in a conventional memory circuit, a plurality of elementary cells arranged in rows and columns, and a control circuit capable of implementing data read or write operations in rows or portions of rows of the array. Unlike a conventional memory circuit where only one row of the array can be selected at a time during a read (and write) operation, the control circuit is capable of simultaneously selecting in read mode a plurality of rows of the array to perform a logic operation having as operands the data contained in the selected rows.

A problem which arises in such a memory circuit is that of the addressing of the operand data on implementation of a calculation operation. Indeed, in a conventional memory circuit of N rows, where N is an integer greater than or equal to 2, the control circuit generally comprises a single row address decoder capable of receiving an address coded over $\log_2(N)$ bits (for example, over 10 bits for a memory of 1,024 rows), and of activating the corresponding row for an operation of reading (or writing) from (or into) this row. To enable to simultaneously activate in read mode K different rows of the array to perform a logic operation with K operands, where K is an integer greater than or equal to 2, a possibility would be to replicate K times the row address decoder, to be able to simultaneously transmit the K operand addresses to the control circuit on implementation of a calculation operation. Such a solution however implies significantly increasing the surface area and the power consumption of the circuit, particularly when number K of operands which are desired to be simultaneously processed is significant.

SUMMARY

Thus, an embodiment provides a memory circuit comprising a plurality of elementary cells arranged in an array of rows and columns, and a control circuit,
wherein each elementary cell comprises:
a first data bit storage node;
a first transistor coupling the first storage node to a first conductive track and having its gate coupled to a second conductive track; and
second and third transistors series-coupled between a first node of application of a reference potential and a third conductive track, the gate of the second transistor being coupled to the first storage node and the gate of the third transistor being coupled to a fourth conductive track,
wherein the elementary cells of a same row are coupled by their second and third conductive tracks and the cells of a same column are coupled by their first and fourth conductive tracks,
and wherein the control circuit is capable of implementing an operation of vertical reading of a word from a column of the array, comprising:
applying a signal for controlling to the on state the third transistor to the fourth conductive track of the column containing the word to be read; and
reading the bits of the word from the third conductive tracks of the rows containing the word to be read.

According to an embodiment, the control circuit is further capable of implementing an operation of horizontal reading of a word from a row of the array, comprising:
applying a signal for controlling to the on state the first transistor to the second conductive track of the row containing the word to be read; and
reading the bits of the word from the first conductive tracks of the columns containing the word to be read.

According to an embodiment, the control circuit is further capable of implementing a logic operation with a plurality of operands stored in different columns, comprising:
simultaneously applying a signal for controlling to the on state the third transistor to the fourth conductive tracks of the columns containing the operands;
reading from the third conductive tracks of the rows containing the operands the bits of the result of the logic operation.

According to an embodiment, the control circuit is capable, on implementation of the logic operation, of performing an initial operation of horizontal reading of an operand selection word from a row of the array, and then of applying the signal for controlling to the on state the transistor to the fourth conductive tracks of the columns identified as operands in the operand selection word.

According to an embodiment, the control circuit is further capable of implementing an operation of vertical writing of a word into a column of the array, comprising:
applying the bits to be written to the second conductive tracks of the rows containing the word to be written; and
simultaneously applying a first binary value writing signal to the first conductive track of the column containing the word to be written.

According to an embodiment, the control circuit is further capable, on implementation of a vertical write operation, before or after the step of application of the bits to be written to the second conductive tracks of the rows containing the word to be written and of simultaneous application of first binary value writing signal to the first conductive track of the column containing the word to be written, of:
applying the bits complementary to the bits to be written to the second conductive tracks of the rows containing the word to be written; and
simultaneously applying a second binary value writing signal to the first conductive track of the column containing the word to be written.

According to an embodiment, each elementary cell further comprises:
a second node for storing a data bit complementary to the bit stored on the first storage node of the cell;

a fourth transistor coupling the second storage node to a fifth conductive track and having its gate coupled to the second conductive track; and fifth and sixth transistors series-coupled between a second node of application of a reference potential and a sixth conductive track, the gate of the fifth transistor being coupled to the second storage node and the gate of the sixth transistor being coupled to a seventh conductive track, the elementary cells of a same row being coupled by their sixth conductive tracks and the cells of a same column being coupled by their fifth and sixth conductive tracks.

According to an embodiment, in each elementary cell, the third and sixth conductive tracks are confounded.

According to an embodiment, in each elementary cell, the third and sixth conductive tracks are distinct.

According to an embodiment, the control circuit is capable, on implementation of a logic operation with a plurality of operands stored in different columns, of:

simultaneously applying a signal for controlling to the on state the third transistor to the fourth conductive tracks of the columns containing the operands and a signal for controlling to the on state the sixth transistor to the seventh conductive tracks of the columns containing the operands; and reading from the third conductive tracks of the rows containing the operands the bits of the result of the logic operation, and reading from the sixth conductive tracks of the rows containing the operands the bits of the result of the complemented logic operation.

According to an embodiment, each elementary cell further comprises a seventh transistor coupling the first storage node to an eighth conductive track and having its gate coupled to a ninth conductive track, and the elementary cells of a same row are coupled by their ninth conductive tracks and the elementary cells of a same column are coupled by their eighth conductive tracks.

According to an embodiment, the control circuit is capable, on implementation of an operation of vertical writing of a word into a column of the array, of:

applying the bits to be written to the second conductive tracks of the rows containing the word to be written and applying the bits complementary to the bits to be written to the ninth conductive tracks of the rows containing the word to be written; and simultaneously applying a first binary value writing signal to the first conductive track of the column containing the word to be written and a second binary value writing signal to the eighth conductive track of the column containing the word to be written.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1:
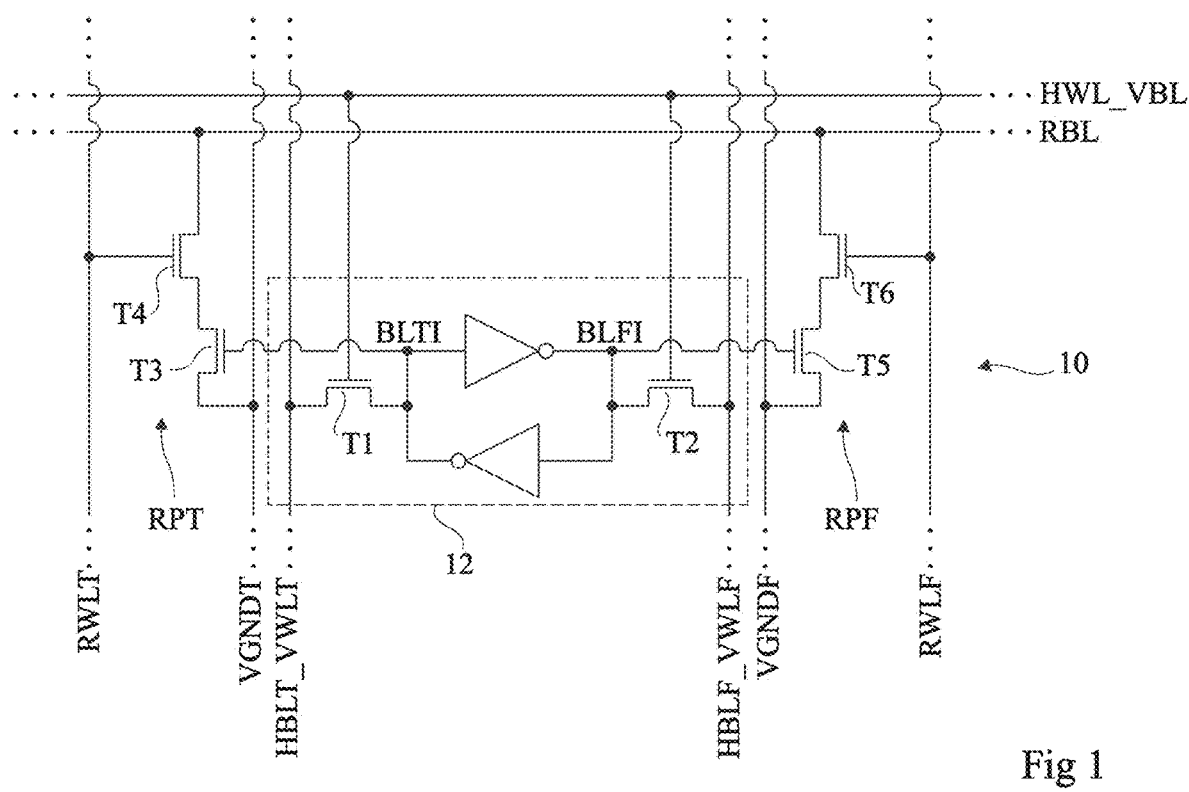
FIG. 1 is a detailed electric diagram of an example of an elementary cell of a memory circuit according to another embodiment.

The same elements have been designated with the same reference numerals in the different drawings. For clarity, only those steps and elements which are useful to the understanding of the described embodiments have been shown and are detailed. In the following description, references to high- and low-level signals should be interpreted relatively, as corresponding to two different states of the binary signals processed by the described circuits. As an example, the high-level signals correspond to potentials in the order of a high power supply potential VDD of the described circuits (for example, equal to VDD to within 0.5 V), and the low-level signals correspond to potentials in the order of a low power supply potential GND of the described circuits (for example, equal to GND to within 0.5 V).

According to an aspect of an embodiment, a memory circuit capable not only of storing data, but also of executing, in situ, during accesses to the memory content, a number of logic and/or arithmetic operations having as operands data stored in the circuit, is provided. The results of the calculations may be transmitted to circuits external to the memory and/or be rewritten into the memory without transiting through circuits external to the memory, and particularly over a data bus external to the memory.

FIG. 1 is a detailed electric diagram of an example of an elementary cell 10 of a memory circuit according to an embodiment.

Elementary cell 10 of FIG. 1 is a cell comprising ten transistors. It comprises a SRAM storage cell 12 comprising six transistors, and two read ports RPT and RPF comprising two transistors each. It should however be noted that the described embodiments may be adapted to other cell types, and particularly to a cell similar to cell but comprising a single read port, that is, a cell comprising eight transistors. Storage cell 12 comprises two inverters (two transistors each) assembled in antiparallel between a first data bit storage node BLTI and a second node BLFI for storing a data bit complementary to the bit stored on node BLTI. Storage cell 12 further comprises a first write access transistor T1 coupling, by its conduction nodes, node BLTI to a conductive track HBLT_VWLT, and a second access transistor T2, coupling, by its conduction nodes, node BLFI to a conductive track HBLF_VWLF. The gates of transistors T1 and T2 are coupled to a same conductive track HWL_VBL. Read port RPT comprises two transistors T3 and T4 series-assembled via their conduction nodes between a conductive track VGNDT of application of a reference potential and a conductive track RBL. Transistor T3 is located on the side of track VGNDT and has its gate connected to node BLTI, and transistor T4 is located on the side of track RBL and has its gate connected to a conductive track RWLT. Read port RPF comprises two transistors T5 and T6 series-assembled via their conduction nodes between a conductive track VGNDF of application of a reference potential and a conductive track RBL. Transistor T5 is located on the side of track VGNDF and has its gate connected to node BLFI, and transistor T6 is located on the side of track RBL and has its gate connected to a conductive track RWLF. In this example, transistors T1, T2, T3, T4, T5, T6 are N-channel MOS transistors.

Figure 2:
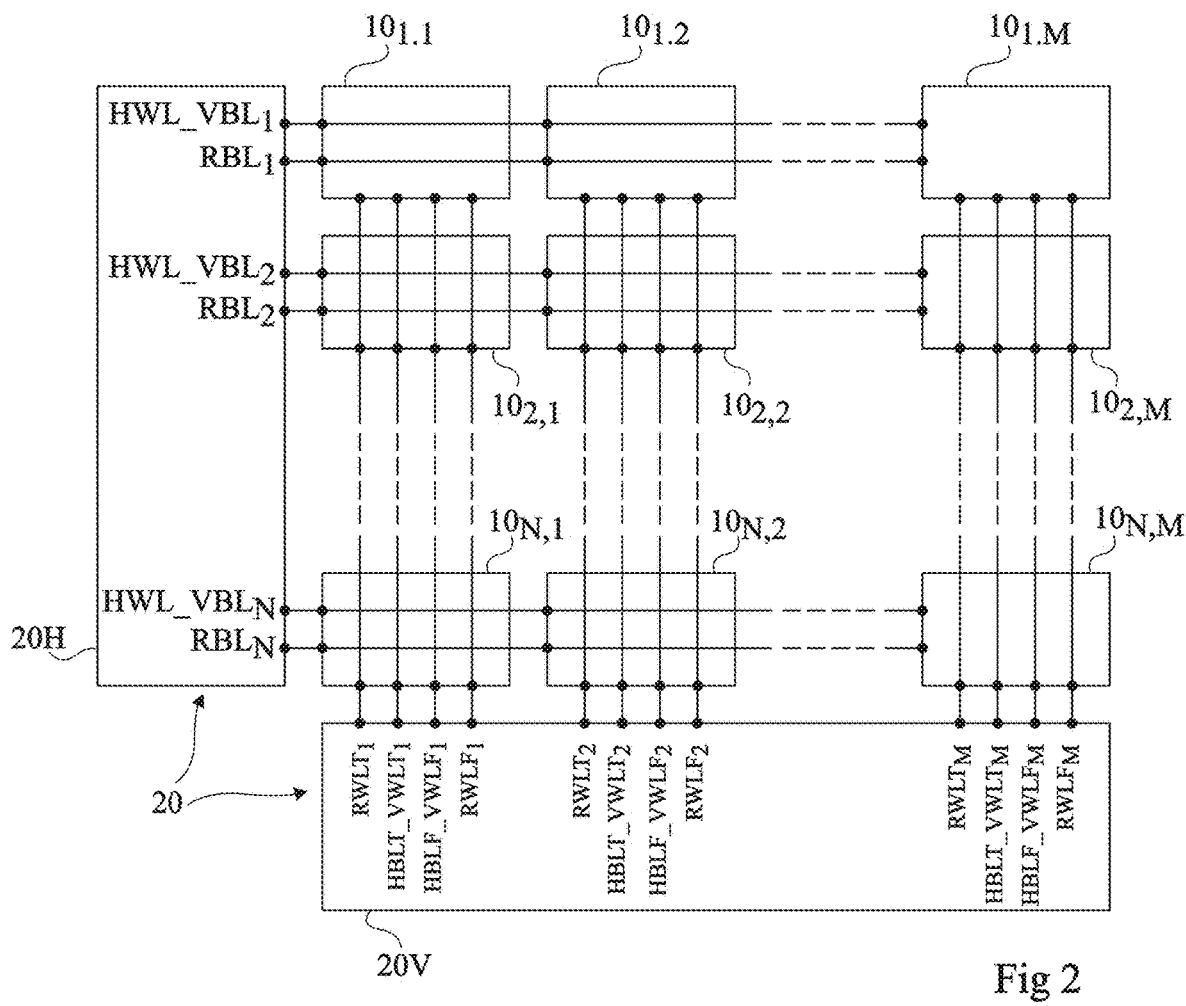
FIG. 2 is a simplified electric diagram of an example of a memory circuit according to an embodiment.

FIG. 2 is a simplified electric diagram of an example of a memory circuit according to an embodiment. The memory circuit of FIG. 2 comprises a plurality of elementary cells identical or similar to cell 10 of FIG. 1, arranged in an array of rows having a first direction (horizontal in the orientation of FIG. 2) and of columns having a second direction different from the first direction, for example, orthogonal to the first direction (vertical in the orientation of FIG. 2). In the example of FIG. 2, the array of elementary cells comprises N rows and M columns, where M and N are integers greater than or equal to 2. In this example, each elementary cell of the array is designated with reference $10_{i,j}$, where i is an integer in the range from 1 to N designating the rank of the row to which the cell belongs and j is an integer in the range from 1 to M designating the rank of the column to which the cell belongs.

The cells of a same row are interconnected via their conductive tracks HWL_VBL and via their conductive tracks RBL, and the cells of a same column are interconnected via their conductive tracks RWLT, via their conductive tracks VGNDT, via their conductive tracks HBLT_VWLT, via their conductive tracks HBLF_VWLF, via their conductive tracks VGNDF, and via their conductive tracks RWLF. In other words, the cells of a same row share a same conductive track HWL_VBL and a same conductive track RBL, and the cells of a same column share a same conductive track RWLT, a same conductive track VGNDT, a same conductive track HBLT_VWLT, a same conductive track HBLF_VWLF, a same conductive track VGNDF, and a same conductive track RWLF. The cells of different rows have different conductive tracks HWL_VBL, respectively RBL, and the cells of different columns have different conductive tracks RWLT, respectively VGNDT, respectively HBLT_VWLT, respectively HBLF_VWLF, respectively VGNDF, respectively RWLF. For simplification, conductive tracks VGNDT and VGNDF have not been shown in FIG. 2. As an example, conductive tracks VGNDT and VGNDF are all connected to a same node of application of a reference potential of the memory circuit, for example, the ground. In this example, for each row of rank i of the array, $HWL\_VBL_i$, respectively $RBL_i$, designates the conductive track HWL_VBL, respectively RBL, shared by the cells of the row, and, for each column of rank j of the array, $RWLT_j$, respectively $HBLT\_VWLT_j$, respectively $HBLF\_VWLF_j$, respectively $RWLF_j$, designates the conductive track RWLT, respectively HBLT_VWLT, respectively HBLF_VWLF, respectively RWLF shared by the cells of the column.

The memory circuit of FIG. 2 further comprises a control circuit or selection circuit 20 comprising a row control (or selection) circuit 20H and a column control (or selection) circuit 20V. Row control circuit 20H is connected to conductive tracks $HWL\_VBL_i$ and $RBL_i$ of the array and is capable of individually controlling or reading the electric signals applied to conductive tracks $HWL\_VBL_i$ and $RBL_i$. Column control circuit 20V is connected to conductive tracks $RWLT_j$, $HBLT\_VWLT_j$, $HBLF\_VWLF_j$, and $RWLF_j$ of the array and is capable of individually controlling or reading the electric signals applied to conductive tracks $RWLT_j$, $HBLT\_VWLT_j$, $HBLF\_VWLF_j$, and $RWLF_j$.

Different operating phases of the memory circuit of FIG. 2, implemented by memory control circuit 20, will now be described. More particularly, the operation of the memory circuit during a write phase, during a vertical reading phase, that is, a phase of reading from a column or a portion of a column of the cell array, during a horizontal reading phase, that is, a phase of reading from a row or a portion of a row of the cell array, and during a phase of implementation of a logic calculation operation, will be described hereafter.

Vertical Writing

During a phase of vertical writing of a data word (that is, a sequence of a plurality of bits) into the memory, the word is written according to a vertical orientation, that is, in the column direction, into the cell array. In other words, the different bits of the word are written into different cells of a same column of the array.

Control circuit 20 comprises a column address decoder capable of receiving the address of the column to be written into, for example, coded over $\log_2(M)$ bits, and of activating in write mode the corresponding column.

The vertical writing operation is carried out in two successive cycles of a clock signal applied to the control circuit. During the first cycle, the bits of the word to be written having a first binary value, for example, value '0', are first written into the addressed column and then, during the second cycle, the bits of the word to be written having the second binary value, for example, binary value '1', are written into the addressed column.

A vertical writing operation concerning an N-bit word, where N is the number of array rows, is considered herein as an example.

During the first cycle, the N bits of the input data word are applied by the control circuit respectively to conductive tracks $HWL\_VBL_1$, $HWL\_VBL_2$, ... $HWL\_VBL_N$ of the cell array. In other words, for each bit of the input word, the corresponding conductive track $HWL\_VBL_i$ is set to a high-level potential (which results in turning on transistors T1 and T2) when the bit has binary value '1' and to a low-level potential (which results in turning off transistors T1 and T2) when the bit has binary value '0'. Further, during the first cycle, column control circuit 20V applies a high-level potential to the conductive track $HBLT\_VWLT_j$ of the addressed column and a low-level potential to the conductive track $HBLF\_VWLF_j$ of this same column. Thus, binary value '1' is written into all the column cells for which the corresponding conductive track $HWL\_VBL_i$ is in the high state (transistors T1 and T2 on). The values of the column cells for which conductive track $HWL\_VBL_i$ is in the low state are however unchanged (transistors T1 and T2 off).

During the second cycle, the N complementary bits of the input data word are applied by the row control circuit respectively to conductive tracks $HWL\_VBL_1$, $HWL\_VBL_2$, ... $HWL\_VBL_N$ of the cell array. In other words, for each bit of the input word, the corresponding conductive track $HWL\_VBL_i$ is set to a low-level potential when the bit has binary value '1' and to a high-level potential when the bit has binary value '0'. Further, during the second cycle, column control circuit 20V applies a low-level potential to the conductive track HBLT_VWLT of the addressed column and a high-level potential to the conductive track HBLF_VWLF of this same column. Thus, binary value '0' is written into all the column cells for which the corresponding conductive track $HWL\_VBL_i$ is in the high state. The values of the column cells for which conductive track $HWL\_VBL_i$ is in the low state are however unchanged.

During the two cycles of the write operation, all the columns of the array other than the addressed column are deactivated in write mode to avoid overwriting the data that they contain. To achieve this, in each of the array columns other than the addressed column, conductive tracks $HBLT\_VWLT_j$ and $HBLF\_VWLF_j$ are maintained at a same potential level, for example, a high-level potential, during the two cycles of the writing operation. This leads to the same biasing conditions as during an operation of reading from a conventional SRAM cell comprising six transistors.

It should be noted that an operation of writing of a vertical word having a dimension smaller than N may be carried out similarly to what has just been described. For this purpose, the conductive tracks HWL_VBL$_i$ of the rows which are not desired to be written into are maintained at a low level during the two cycles of the writing operation, to maintain transistors T1 and T2 off in the corresponding cells.

Vertical Reading

During a vertical reading operation, the control circuit reads from the memory a data word having a vertical orientation, that is, in the direction of the columns of the cell array. In other words, all the bits of the word are read from a same column of the array.

Control circuit 20 comprises a column address decoder capable of receiving the address of the column to be read from, for example, coded over log$_2$(M) bits, and of activating in read mode the corresponding column. The vertical reading operation is carried out within a single clock cycle.

A reading operation bearing on an N-bit word, where N is the number of rows of the array, is considered herein.

Before the actual reading operation, all the conductive tracks RBL$_i$ of the array are first precharged to a high-level potential, and then left floating. During the vertical reading cycle, each of the cells of the addressed column has its read port RPF activated and its read port RPT deactivated. In other words, in each of the cells of the addressed column, transistor T6 is on (conductive) and transistor T4 is off (non-conductive). For this purpose, in the present example, a high-level potential is applied to conductive track RWLF$_j$ of the addressed column and a low-level potential is applied to the conductive track RWLT$_j$ of this same column. In all the other columns of the array, read ports RPT and RPF are deactivated. For this purpose, in each of the columns other than the addressed column, conductive tracks RWLF$_j$ and RWLT$_j$ are set to a low-level potential. In each of the cells of the addressed column containing binary value '0', node BLFI is at a high-level potential, so that transistor T5 is conductive. Since transistor T6 is also conductive, the corresponding conductive track RBL$_i$ discharges. Conversely, in all the cells of the addressed column containing binary value '1', node BLFI is at a low-level potential, so that transistor T5 remains off. The corresponding conductive track RBL$_i$ thus does not discharge.

The control circuit is capable of reading the N bits of the data word from output conductive tracks RBL$_1$ to RBL$_N$ of the array. More particularly, for each bit of the addressed word, the corresponding conductive track RBL$_i$ is at a potential of relatively high level if the data bit has binary value '1' and at a relatively low-level potential if the data bit has binary value '0'.

As a variation, to read the complemented value of the word stored in the addressed column, the control circuit may be configured to, instead of activating ports RPF and of deactivating ports RPT of the cells of the addressed column, activate ports RPT and deactivate ports RPF of the addressed column.

Of course, a complemented or non-complemented operation of reading of a vertical word having a dimension smaller than N may be carried out similarly to what has just been described. For this purpose, the control circuit is configured to only read a portion of the conductive tracks RBL$_i$ corresponding to the column portion having the word which is desired to be read stored therein.

Horizontal Reading

During a horizontal reading operation, the control circuit reads from the memory a data word having a horizontal orientation, that is, in the direction of the cell array. In other words, all the bits of the word are read from a same row of the array.

Control circuit 20 comprises a row address decoder capable of receiving the address of the row to be read from, for example, coded over log$_2$(N) bits, and of activating in read mode the corresponding row. The horizontal reading operation is carried out within a single clock cycle.

A reading operation bearing on an M-bit word, where M is the number of columns of the array, is considered herein as an example.

During the horizontal reading cycle, the conductive track HWL_VBL$_i$ of the addressed row is set to a high-level potential to turn on the transistors T1 and T2 of the cells of the row. The conductive tracks HWL_VBL$_i$ of the other rows of the array are set to a low-level potential to turn off the transistors T1 and T2 of the cells of these rows. The M bits of the selected row are then read by the control circuit, for example, by differential reading, respectively from the M pairs of conductive tracks HBLT_VWLT$_1$, HBLF_VWLF$_1$ to HBLT_VWLT$_M$, HBLF_VWLF$_M$.

Of course, an operation of reading of a horizontal word having a dimension smaller than M may be carried out similarly to what has just been described. For this purpose, the control circuit is configured to only read a portion of the pairs of conductive tracks HBLT_VWLT$_j$, HBLF_VWLF$_j$ corresponding to the columns of the array having the horizontal word which is desired to be read stored therein.

Logic Calculation

To perform a logic calculation operation, control circuit 20 starts by reading from the memory an operand selection vector in the form of a horizontal word, that is, a word stored in a single row of the cell array. The reading of the operand selection vector is performed within one clock cycle according to the above-described horizontal reading method. The address of the row containing the operand selection vector may be a predetermined address stored in the memory control circuit, or an address supplied to the memory control circuit by an external control device. The operand selection vector for example comprises a number of bits equal to the number of columns comprised in the array of elementary cells, that is, M bits in the present example. As a variation, the operand selection vector may comprise a number of bits smaller than M. At the end of the horizontal reading cycle, the operand selection vector is for example stored in a temporary storage register of the control circuit.

Then, the operand selection vector is used as a selection mask to simultaneously activate in vertical read mode a plurality of columns of the array. As an example, for each bit of the operand selection vector, the corresponding column of the array is activated in vertical read mode if the corresponding bit of the operand selection vector is at binary value '1', and is not activated in vertical read mode if the corresponding bit of the operand selection vector is at binary value '0'.

As previously indicated, a column is activated in vertical read mode when its conductive tracks RWLT$_j$ and RWLF$_j$ are respectively at a low-level potential and at a high-level potential (case of a non-complemented vertical reading), or respectively at a high-level potential and at a low-level potential (case of a complemented vertical reading). The data contained in the column are then read from conductive tracks RBL$_1$ to RBL$_N$. A column which is not activated in vertical read mode has its two conductive tracks RWLT$_j$ and RWLF$_j$ at a low-level potential.

As an illustration, it is considered that two columns of rank j and j+1 are simultaneously activated in non-complemented vertical read mode. To achieve this, after having precharged to a high-level potential the conductive tracks RBL$_i$ of the array, access ports RPF of the cells of the columns of rank j and j+1 are simultaneously activated, the access ports RPT of said cells and the access ports RPT and RPF of all the other cells of the array being maintained inactive. In other words, the selection transistors T6 of the cells of the columns of rank j and j+1 are simultaneously turned on, the selection transistors T4 of said cells and the selection transistors T4 and T6 of all the other cells of the array being maintained off.

For each row of rank i of the array, calling A the binary value stored on node BLTI of cell 10$_{i,j}$ and B the binary value stored on node BLTI of cell 10$_{i,j+1}$. Cell 10$_{i,j}$ then stores on its node BLFI the complementary $\overline{A}$ of value A, and cell 10$_{i,j+1}$ stores on its node BLFI the complementary $\overline{B}$ of value B. The output conductive track RBL$_i$ of the row remains at its high precharge level only if the two values A and B are at a high level. The level read from output track RBLT of the column at the end of the reading operation thus corresponds to result A.B of a logic AND calculation operation between the two selected cells of the row. Thus, the value read by the control circuit from conductive tracks RBL$_1$ to RBL$_N$ of the array corresponds to the result of the AND logic operation between a vertical word stored in the column of rank j and a vertical word stored in the column of rank j+1.

By simultaneously activating in non-complemented vertical read mode a number greater than two of columns of the array, the same AND logic operation is carried out, but with a number of operands greater than two.

By simultaneously activating a plurality of columns in complemented vertical reading, a logic NOR calculation operation is carried out between the words stored in the activated columns.

Thus, a logic AND or NOR operation may be carried out in two clock cycles, a first cycle to read the operand selection word by horizontal reading from a row of the array, and a second cycle to activate in vertical reading the columns identified as operands in the operand selection word. If the vertical reading is performed via the RPF port (non-complemented reading), the operation carried out is a logic AND. If the vertical reading is performed via the RPT port (complemented reading), the operation carried out is a logic NOR. It should be noted that if it is provided to load the operand selection word from the outside of the circuit, the logic AND or NOR calculation operation may be performed within a single cycle. In this example, if the two AND and NOR logic operations are desired to be carried out, three clock cycles are necessary, a first cycle to read the operand selection word, a second cycle to activate in non-complemented vertical reading the columns identified as operands in the operand selection word, and then a third cycle to activate in complemented vertical reading the columns identified as operands in the operand selection word (or two cycles if the operand selection word is provided to be loaded from the outside of the circuit).

An advantage of the memory circuit described in relation with FIGS. 1 and 2 is that it enables to directly implement basic logic operations in the memory, without requiring having the data transit through an arithmetic and logic unit external to the circuit.

Further, whatever number K of operands of the calculation operation, the addressing of the operand data is performed in simple fashion, by means of an operand selection word previously stored in the array and capable of being read within a single clock cycle according to the above-mentioned horizontal reading method. In particular, the above-described memory circuit advantageously enables to perform a logic calculation operation with K operands without having to effectively decode the K addresses of the operands by means of an address decoder.

The result of the logic calculation operation may be transmitted to circuits external to the memory and/or be rewritten into the memory without transiting through circuits external to the memory, and particularly through a data bus external to the memory.

To enable the rewriting of the result of a logic operation without having the calculated data transit through circuits external to the memory, and particularly over a data bus external to the memory, the memory control circuit may further comprise a temporary storage register, not detailed, enabling to store the result of the calculation operation read from output conductive tracks RBL$_i$, for its rewriting into a column of the array according to the above-mentioned vertical writing method or according to a horizontal reading method.

Figure 3:
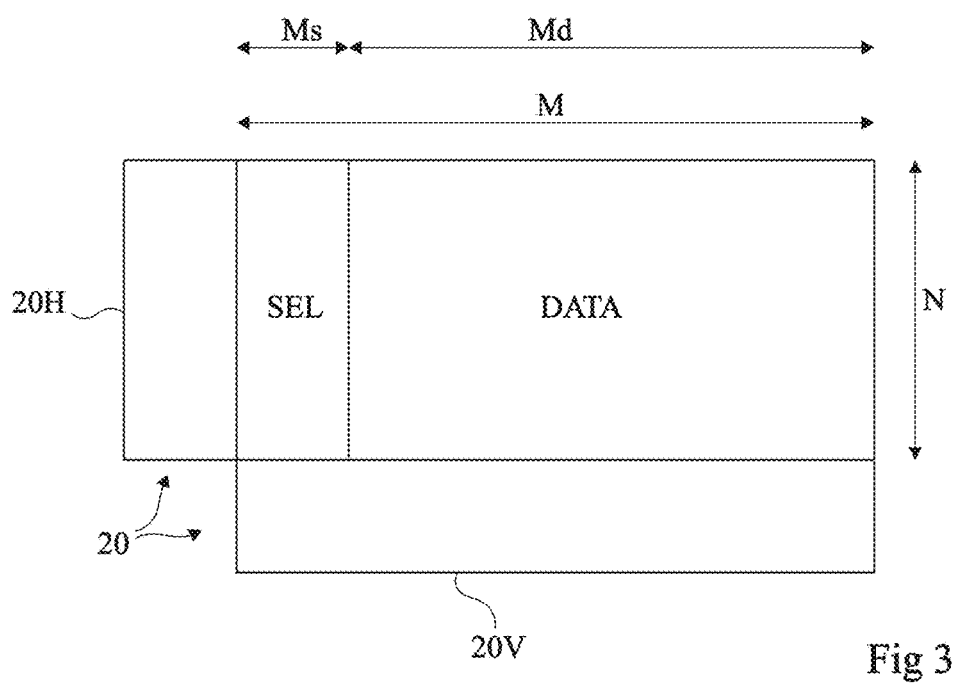
FIG. 3 is a simplified representation of the memory circuit of FIG. 2, illustrating an example of arrangement of the data in the array of elementary cells of the circuit.

FIG. 3 is a simplified representation of the memory circuit of FIG. 2, illustrating a possible example of arrangement of the operand data and of the operand selection data in the array of elementary cells.

As previously described, the memory circuit of FIG. 3 comprises an array of N rows and M columns of elementary cells. In the example of FIG. 3, the operand selection data are stored in the form of horizontal words in a first sub-array SEL of N rows and Ms columns, where Ms is an integer smaller than M, and the operand data are stored in the form of vertical words in a second sub-array DATA of N rows and Md columns distinct from the first sub-array, where Md is an integer smaller than M such that Md+Ms=M. As a variation, the operand selection data are stored in the form of vertical words in sub-array SEL and the operand data are stored in the form of horizontal words in sub-array DATA.

Figure 4:
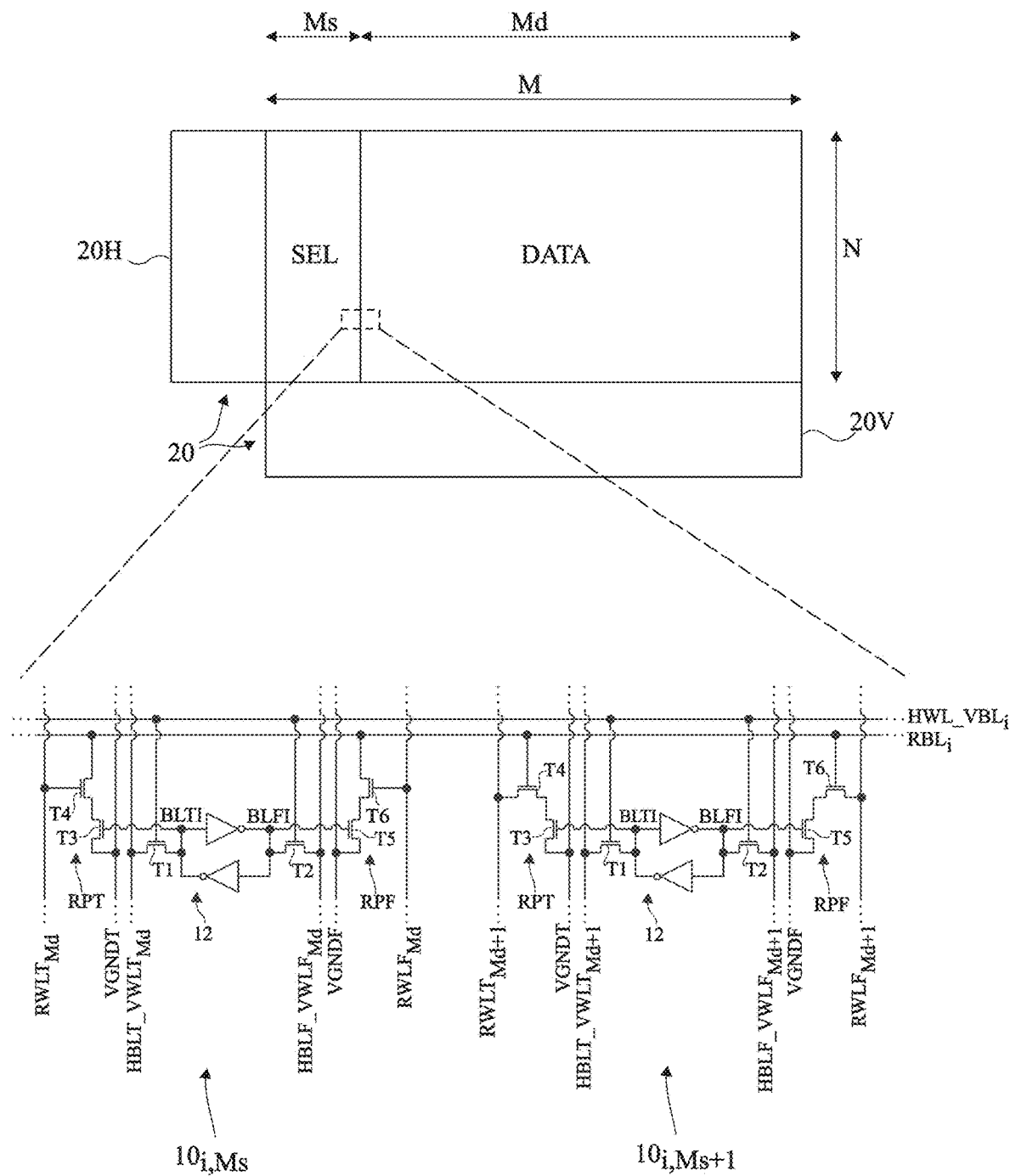
FIG. 4 schematically shows another embodiment of a memory circuit.

FIG. 4 illustrates an alternative embodiment of the memory circuit of FIG. 3, where the elementary cells of sub-array SEL storing the operand selection data and the elementary cells of sub-array DATA storing the operand data are of different natures. More particularly, in the example of FIG. 4, sub-array SEL is formed of elementary cells identical to the cells 10 described in relation with FIG. 1, and sub-array DATA is formed of elementary cells different from cells 10 of FIG. 1.

FIG. 4 shows an enlargement of a portion of a row of rank i of the array, located at the junction between sub-arrays SEL and DATA. More particularly, the row portion shown in FIG. 4 comprises two consecutive elementary cells 10$_{i,Ms}$ and 10$_{i,Ms+1}$, cell 10$_{i,Ms}$ being the last cell in the row belonging to sub-array SEL and cell 10$_{i,Ms+1}$ being the first cell in the row belonging to sub-array DATA.

As illustrated in FIG. 4, the elementary cells of sub-array SEL are identical to cell 10 of FIG. 1, and are interconnected in an array of rows and columns according to an arrangement identical or similar to what has been described in relation with FIG. 2.

The elementary cells of sub-array DATA differ from the elementary cells of sub-array SEL essentially in that, in each elementary cell 10$_{i,j}$ of sub-array DATA:

the transistors T3 and T4 of read port RPT of the cell are series-connected, via their conduction nodes, between conductive track VGNDT and conductive track RWLT of the cell, transistor T4 being located on the side of track RWLT and having its gate coupled to conductive track RBL of the cell; and the transistors T5 and T6 of read port RPF of the cell are series-connected, via their conduction nodes, between conductive track VGNDF and conductive track RWLF of the cell, transistor T6 being located on the side of track RWLF and having its gate coupled to conductive track RBL of the cell.

The elementary cells of sub-array DATA are interconnected in an array of rows and columns according to an arrangement identical to similar to what has been described in relation with FIG. 2.

In the example of FIG. 4, sub-arrays SEL and DATA are directly connected. More particularly, in each row of rank i of the memory circuit, elementary cells $10_{i,1}$ to $10_{i,Ms}$, belonging to sub-array SEL, and elementary cells $10_{i,Ms+1}$ to $10_{i,M}$, belonging to sub-array DATA, share the same conductive track $RBL_i$ and the same conductive track $HWL\_VBL_i$.

Figure 5:
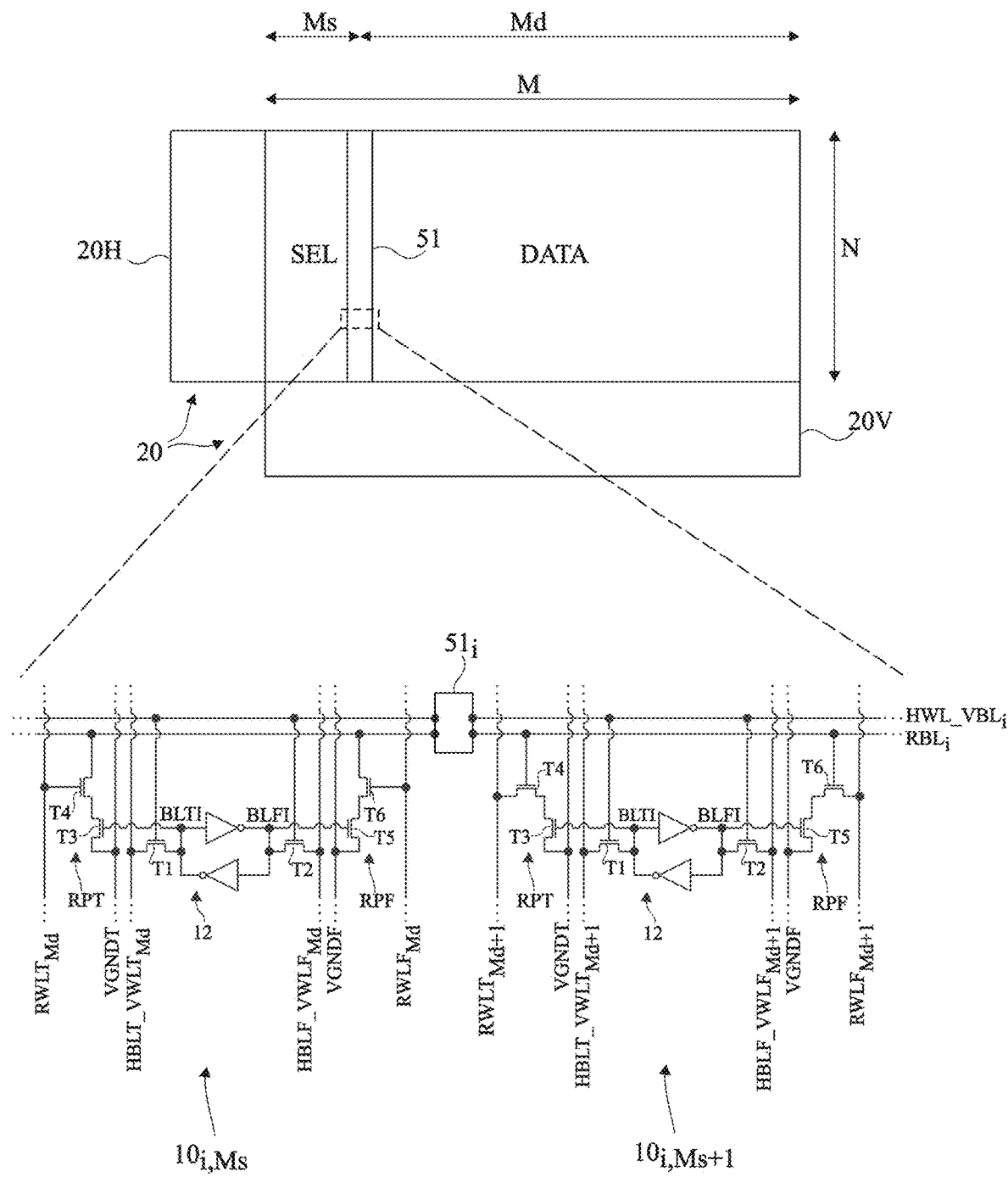
FIG. 5 schematically shows an alternative embodiment of the memory circuit of FIG. 4.

FIG. 5 illustrates an alternative embodiment of the memory circuit of FIG. 4. The memory circuit of FIG. 5 differs from the memory circuit of FIG. 4 in that, in the example of FIG. 5, sub-arrays SEL and DATA are not directly connected to each other but are coupled to each other by an interface circuit 51. More particularly, in the example of FIG. 5, in each row of rank i of the array, an interface circuit $51_i$ couples, on the one hand, conductive track $HWL\_VBL_i$ of the row of rank i of sub-array SEL to conductive track $HWL\_VBL_i$ of the row of rank i of sub-array DATA and, on the other hand, conductive track $RBL_i$ of the row of rank i of sub-array SEL to conductive track $RBL_i$ of the row of rank i of sub-array DATA. As an example, interface circuit $51_i$ comprises a buffer and/or an inverter coupling conductive track $HWL\_VBL_i$ of the row of rank i of sub-array SEL to conductive track $HWL\_VBL_i$ of the row of rank i of sub-array DATA, and a buffer and/or an inverter coupling the conductive track $RBL_i$ of the row of rank i of sub-array SEL to the conductive track $RBL_i$ of the row of rank i of sub-array DATA.

Figure 6:
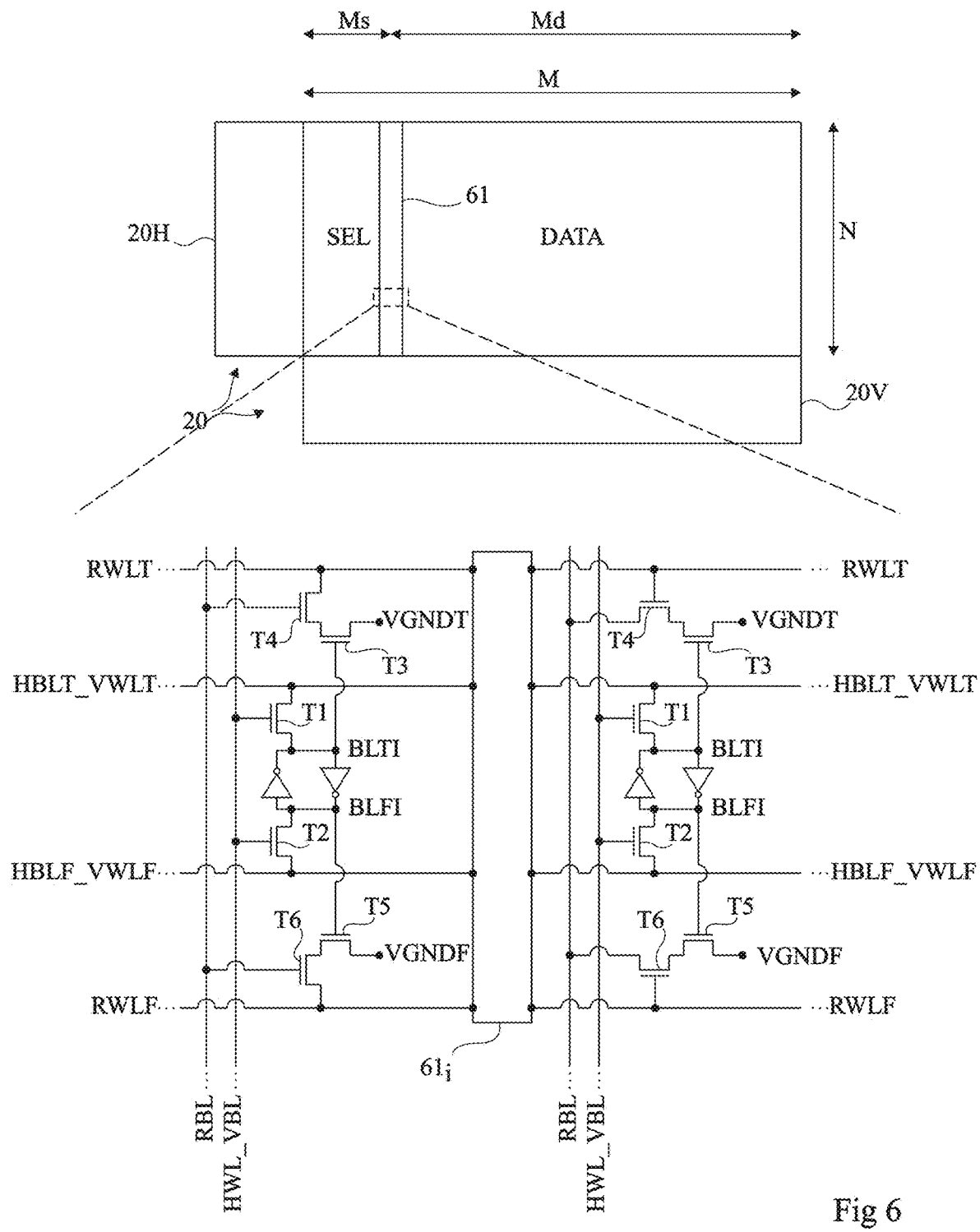
FIG. 6 schematically shows another alternative embodiment of the memory circuit of FIG. 4.

FIG. 6 illustrates another alternative embodiment of the memory circuit of FIG. 3, where the elementary cells of sub-array SEL storing the operand selection data and the elementary cells of sub-array DATA storing the operand data are of different natures.

In the example of FIG. 6, sub-array DATA is formed of elementary cells identical to cells 10 described in relation with FIG. 1. However, the cell interconnection diagram is different from what has been described in relation with FIG. 2. More particularly, in the example of FIG. 6, the elementary cells of a same row of sub-array DATA are interconnected via their conductive tracks RWLT, respectively HBLT_VWLT, respectively HBLF_VWLF, respectively RWLF, and the elementary cells of a same row of sub-array DATA are interconnected via their conductive tracks RBL, respectively HWL_VBL.

Further, in the example of FIG. 6, sub-array SEL is formed of elementary cells of the same type as the elementary cells of sub-array DATA of the memory circuit of FIG. 4. However, the cell interconnected diagram is different from what has been previously described. More particularly, in the example of FIG. 6, the elementary cells of a same row of sub-array SEL are interconnected via their conductive tracks RWLT, respectively HBLT_VWLT, respectively HBLF_VWLF, respectively RWLF, and the elementary cells of a same row of sub-array SEL are interconnected via their conductive tracks RBL, respectively HWL_VBL.

In the example of FIG. 6, sub-arrays SEL and DATA are coupled to each other by an interface circuit 61. More particularly, in the example of FIG. 6, in each row of rank i of the array, an interface circuit $61_i$ couples the conductive track RWLT of the row of rank i of sub-array SEL to the conductive track RWLT of the row of rank i of sub-array DATA, the conductive track HBLT_VWLT of the row of rank i of sub-array SEL to the conductive track HBLT_VWLT of the row of rank i of sub-array DATA, the conductive track HBLF_VWLF of the row of rank i of sub-array SEL to the conductive track HBLF_VWLF of the row of rank i of sub-array DATA, and the conductive track RWLF of the row of rank i of sub-array SEL to the conductive track RWLF of the row of rank i of sub-array DATA. As an example, interface circuit $61_i$ comprises a buffer and/or an inverter coupling conductive track RWLT of the row of rank i of sub-array SEL to the conductive track RWLT of the row of rank i of sub-array DATA, a buffer and/or an inverter coupling the conductive track HBLT_VWLT of the row of rank i of sub-array SEL to the conductive track HBLT_VWLT of the row of rank i of sub-array DATA, a buffer and/or an inverter coupling the conductive track HBLF_VWLF of the row of rank i of sub-array SEL to the conductive track HBLF_VWLF of the row of rank i of sub-array DATA, and a buffer and/or an inverter coupling the conductive track RWLF of the row of rank i of sub-array SEL to the conductive track RWLF of the row of rank i of sub-array DATA.

The configuration of FIG. 6 is particularly advantageous in the case where number N of rows of the memory circuit is relatively small as compared with number M of columns, since the dimension of the elementary cells in the column direction is larger than in the row direction. Thus, the general memory circuit will have a less elongated/rectangular form factor, allowing a better implementation and a better access/connection at the system level.

Figure 7:
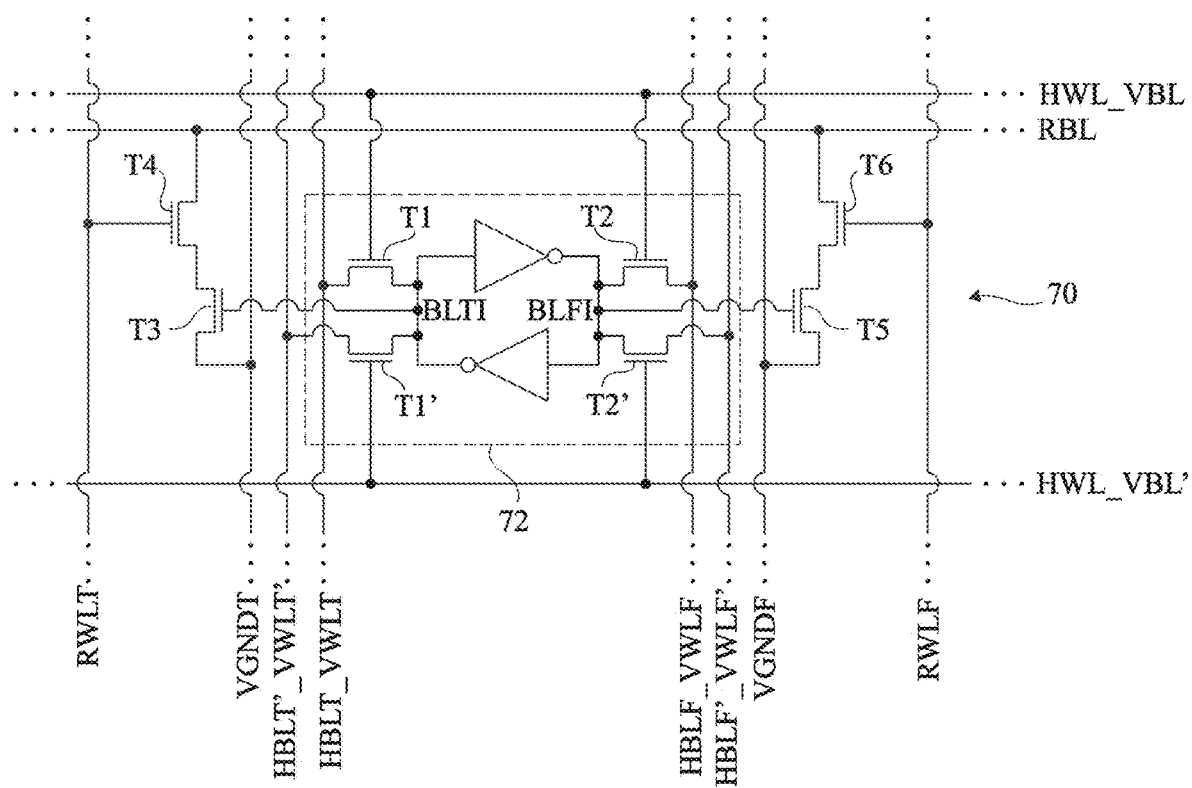
FIG. 7 is a detailed electric diagram of another embodiment of an elementary cell of a memory circuit according to an embodiment.

FIG. 7 is a detailed electric diagram of another example of an elementary cell 70 of a memory circuit according to an embodiment. Elementary cell 70 of FIG. 7 differs from elementary cell 10 of FIG. 1 in that, in elementary cell 70, the SRAM storage cell 12 comprising six transistors of FIG. 1 has been replaced with a SRAM storage cell 72 comprising eight transistors. SRAM storage cell 72 comprises the same elements as cell 12 of FIG. 1, arranged substantially in the same way, and further comprises a first additional access transistor T1' coupling, by its conduction nodes, node BLTI to a first additional conductive track HBLT_VWLT' and a second additional access transistor T2' coupling, by its conduction nodes, node BLFI to a second additional conductive track HBLF_VWLF'. The gates of transistors T1' and T2' are coupled to a same third additional conductive track HWL_VBL'. In this example, additional transistors T1' and T2' are N-channel MOS transistors.

A memory circuit according to an embodiment may comprise a plurality of elementary cells 70 of the type described in relation with FIG. 7, arranged in an array of rows and columns similarly to what has been described in relation with FIG. 2. In this case, in addition to the interconnects already described in relation with FIG. 2, the elementary cells are interconnected in rows via additional conductive tracks HWL_VBL' and in columns via additional conductive tracks HBLT_VWLT' and HBLF_VWLF'.

An advantage of such a configuration is that it enables to perform an operation of writing of a vertical word within a single clock cycle instead of two in the example described in relation with FIGS. 1 and 2.

For this purpose, during the write operation, the bits of the word to be written are applied by the control circuit respectively to conductive tracks $HWL\_VBL_1$, $HWL\_VBL_2$, . . . $HWL\_VBL_N$ of the cell array (in the case of a writing of an N-bit word). In other words, for each bit of the input word, the corresponding conductive track $HWL\_VBL_i$ is set to a low-level potential when the bit has binary value '1' and to a high-level potential when the bit has binary value '0'.

The complementary bits of the word to be written are further simultaneously applied to conductive tracks $HWL\_VBL'_1$, $HWL\_VBL'_2$, ... $HWL\_VBL'_N$ of the cell array. In other words, for each bit of the input word, the corresponding conductive track $HWL\_VBL'_i$ is set to a high-level potential when the bit to be written into the selected cell has binary value '0' and to a low-level potential when the bit has binary value '1'.

Further, during the write operation, the control circuit applies:

a high-level potential to the conductive track HBLT_VWLT of the addressed column and a low-level potential to the conductive track HBLF_VWLF of this same column; and a low-level potential to the conductive track HBLT_VWLT' of the addressed column and a high-level potential to the conductive track HBLF_VWLF' of this same column.

Thus, binary value '1' is written into all the column cells for which the corresponding conductive tracks $HWL\_VBL_i$ and $HWL\_VBL'_i$ are respectively in the high state and in the low state (transistors T1 and T2 on and transistors T1' and T2' off), and binary value '0' is written into all the column cells for which conductive tracks $HWL\_VBL_i$ and $HWL\_VBL'_i$ are respectively in the low state and in the high state (transistors T1 and T2 off and transistors T1' and T2' on).

During the write operation, all the columns of the array other than the addressed column are deactivated in write mode to avoid overwriting the data that they contain. For this purpose, in each of the array columns other than the addressed column, conductive tracks $HBLT\_VWLT_j$ and $HBLF\_VWLF_j$, on the one hand, and $HBLT\_VWLT'_j$ and $HBLF\_VWLF'_j$, on the other hand, are maintained at a same potential level, for example, a high-level potential, corresponding to a conventional reading (which thus keeps the stored information).

To perform an operation of writing of a vertical word having a dimension smaller than N, the conductive tracks $HWL\_VBL_i$ and $HWL\_VBL'_i$ of the rows which are not desired to be written into are maintained at a low level during the write operation, to maintain transistors T1, T2, T1', and T2' off in the corresponding cells.

Figure 8:
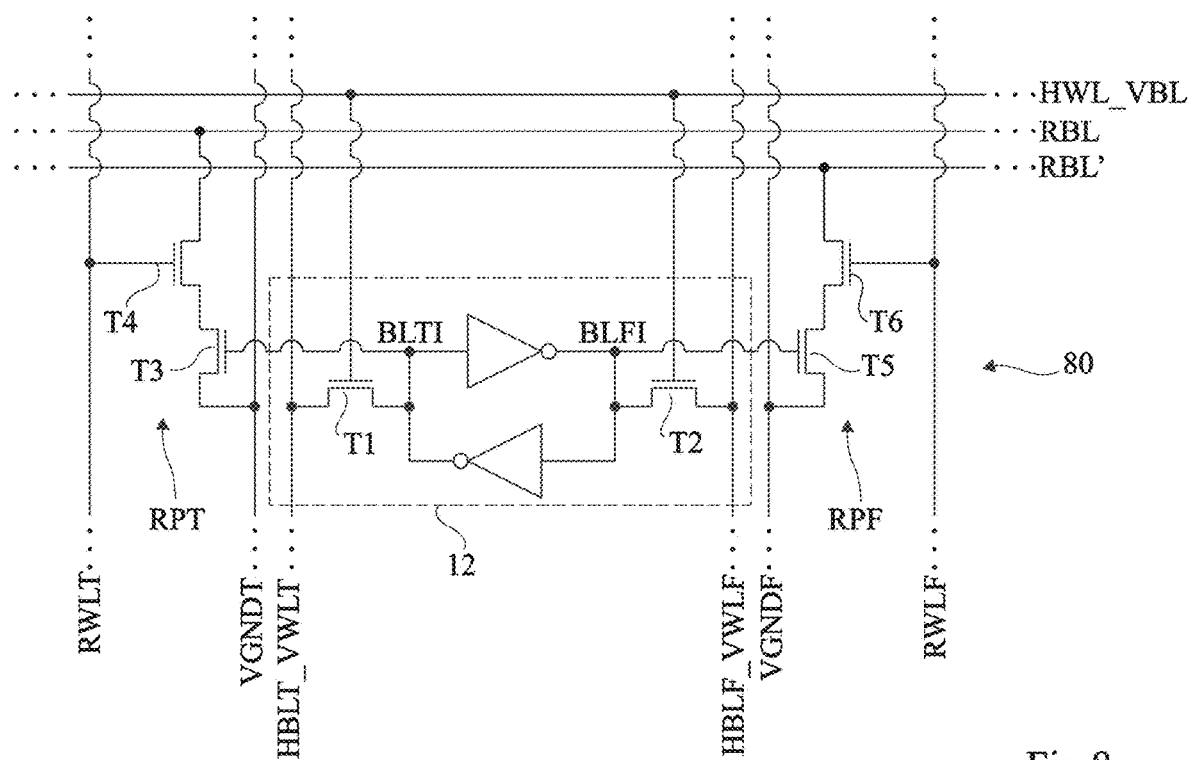
FIG. 8 is a detailed electric diagram of another embodiment of an elementary cell of a memory circuit according to an embodiment.

FIG. 8 is a detailed electric diagram of another example of an elementary cell 80 of a memory circuit according to an embodiment. Elementary cell 80 of FIG. 8 comprises the same elements as elementary cell 10 of FIG. 1, and further comprises an additional conductive track RBL'. In elementary cell 80 of FIG. 8, the two transistors T3 and T4 of read port RPT are, as in the example of FIG. 1, series-connected via their conductive nodes between conductive track VGNDT and conductive track RBL. Elementary cell 80 of FIG. 8 differs from elementary cell 10 of FIG. 1 in that, in cell 80, transistors T5 and T6 are series-connected, not between conductive track VGNDF and conductive track RBL, but between conductive track VGNDF and conductive track RBL'.

A memory circuit according to an embodiment may comprise a plurality of elementary cells 80 of the type described in relation with FIG. 8, arranged in an array of rows and columns similarly to what has been described in relation with FIG. 2. In this case, in addition to the interconnects already described in relation with FIG. 2, the elementary cells are interconnected in rows via additional conductive tracks RBL'.

An advantage of such a configuration is that it enables to perform a complemented vertical reading and a non-complemented vertical reading within a same clock cycle. Further, such a configuration enables to perform the logic AND and NOR calculation operations within a same clock cycle.

To perform a vertical reading operation, the control circuit simultaneously activates the read ports RPT and RPF of all the cells of the addressed columns. To achieve this, in this example, the control circuit simultaneously applies a high-level potential to the conductive tracks RWLT and RWLF of the addressed column. In all the other columns of the array, read ports RPT and RPF are deactivated. Prior to this, all the conductive tracks $RBL_i$ and $RBL'_i$ of the array have been precharged to a high-level potential.

The control circuit is capable of reading the bits of the data word from the output conductive tracks $RBL_i$ of the array, and the complementary bits of the data word from output conductive tracks $RBL'_i$ of the array.

To perform a logic calculation operation, control circuit 20 starts, as in the example described in relation with FIGS. 1 and 2, by reading from the memory an operand selection vector in the form of a horizontal word.

Then, the operand selection vector is used as a selection mask to simultaneously activate in vertical read mode a plurality of columns of the array. In the example of FIG. 8, the control circuit simultaneously activates read ports RPT and RPF of the cells of each activated column. To achieve this, the control circuit simultaneously applies a high-level potential to the two conductive tracks RWLT and RWLF of each activated column. Read ports RPT and RPF of the non-selected columns are however maintained inactive (transistors T4 and T6 off).

The control circuit is capable of reading the bits of the result of the AND logic operation from the conductive tracks $RBL_i$ of the array, and the bits of the result of the logic NOR operation from the conductive tracks $RBL'_i$ of the array.

Specific embodiments have been described. Various alterations and modifications will occur to those skilled in the art. In particular, the described embodiments are not limited to the specific examples described hereabove where the transistors of the elementary cells of the memory circuit are all N-channel MOS transistors. As a variation, other types of transistors may be used, for example, P-channel MOS transistors. It will then be within the abilities of those skilled in the art to accordingly adapt the levels of the control signals applied to the cells to obtain the desired operation.

Further, the described embodiments are not limited to the specific examples described hereabove where each elementary cell of the memory circuit comprises two access ports. It will be within the abilities of those skilled in the art to adapt the described embodiments to elementary cells comprising a single access port. As an example, referring to FIG. 1, transistors T2, T5, and T6 and conductive tracks HBLF_VWLF, VGNDF, and RWLF may be omitted. Similarly, referring to FIG. 7, transistors T2 and T2', T5, and T6 and conductive tracks HBLF_VWLF, HBLF_VWLF', VGNDF, and RWLF may be omitted.

Further, the described embodiments are not limited to the above-described examples where the elementary cells of the memory circuit are SRAM-type cells. More generally, the described embodiment may apply to other cell technologies, for example, ReRAM-type cells (non-volatile resistive memory) or DRAM-type cells (capacitive dynamic memory).

As an example, to form a ReRAM-type memory circuit, it may be provided, in cells 12 (FIGS. 1 and 8) and 72 (FIG. 7) of the above-described examples, to replace the antiparallel association of two inverters with a series association of two resistive elements having a programmable resistance, a first end of said series association being coupled to a node of application of a high power supply potential of the cell, the second end of said series association being coupled to a node of application of a low power supply potential of the cell, and the intermediate node of said series association, or junction point of the two resistive elements, forming storage node BLTI of the cell.

As a variation, to form a DRAM-type memory circuit, it may be provided, in cells 12 (FIGS. 1 and 8) and 72 (FIG. 7) of the above-described examples, to replace the antiparallel association of two inverters with a capacitive element having a first electrode coupled, for example, connected, to node BLTI, and a second electrode coupled, for example, connected, to a node of application of a reference potential of the cell.

Further, various embodiments with different variations have been described hereabove. It will be within the abilities of those skilled in the art to combine various elements of these various embodiments and variations without showing any inventive step. In particular, the alternative embodiments of FIGS. 7 and 8 may be combined.

The invention claimed is:

1. A memory circuit comprising a plurality of elementary cells arranged in an array of rows and columns and a control circuit,
wherein each elementary cell comprises:
a first data bit storage node;
a first transistor coupling the first storage node to a first conductive track and having its gate coupled to a second conductive track; and
a second and a third transistor series-coupled between a first node of application of a reference potential and a third conductive track, the gate of the second transistor being coupled to the first storage node and the gate of the third transistor being coupled to a fourth conductive track,
wherein the elementary cells of a same row share a same second conductive track and a same third conductive track and the cells of a same column share a same first conductive track and a same fourth conductive track,
wherein the control circuit is configured to implement an operation of vertical reading of a word from a column of the array, comprising:
applying, to the fourth conductive track of the column containing the word to be read, a signal for controlling the third transistor to an on state; and
reading the bits of the word from the third conductive tracks of the rows containing the word to be read;
wherein the control circuit is further configured to implement an operation of horizontal reading of a word from a row of the array, comprising:
applying, to the second conductive track of the row containing the word to be read, a signal for controlling the first transistor to an on state; and
reading the bits of the word from the first conductive tracks of the columns containing the word to be read.

2. The memory circuit of claim 1, wherein the control circuit is further configured to implement a logic operation with a plurality of operands stored in different columns, comprising:
simultaneously applying, to the fourth conductive tracks of the columns containing the operands, a signal for controlling to the third transistor to an on state;
reading from the third conductive tracks of the rows containing the operands the bits of the result of the logic operation.

3. The memory circuit of claim 2, wherein the control circuit is configured, on implementation of the logic operation, to perform an initial operation of horizontal reading of an operand selection word from a row of the array, and then of applying, to the fourth conductive tracks of the columns identified as operands in the operand selection word, the signal for controlling the third transistor to an on state.

4. A memory circuit comprising a plurality of elementary cells arranged in an array of rows and columns and a control circuit,
wherein each elementary cell comprises:
a first data bit storage node;
a first transistor coupling the first storage node to a first conductive track and having its gate coupled to a second conductive track; and
a second and a third transistor series-coupled between a first node of application of a reference potential and a third conductive track, the gate of the second transistor being coupled to the first storage node and the gate of the third transistor being coupled to a fourth conductive track,
wherein the elementary cells of a same row share a same second conductive track and a same third conductive track and the cells of a same column share a same first conductive track and a same fourth conductive track,
wherein the control circuit is configured to implement an operation of vertical reading of a word from a column of the array, comprising:
applying, to the fourth conductive track of the column containing the word to be read, a signal for controlling the third transistor to an on state; and
reading the bits of the word from the third conductive tracks of the rows containing the word to be read;
wherein the control circuit is further configured to implement an operation of vertical writing of a word into a column of the array, comprising:
applying the bits to be written to the second conductive tracks of the rows containing the word to be written; and
simultaneously applying a first binary value writing signal to the first conductive track of the column containing the word to be written;
wherein the control circuit is further configured, on implementation of a vertical write operation, before or after the steps of application of the bits to be written to the second conductive tracks of the rows containing the word to be written and of simultaneous application of the first binary value writing signal to the first conductive track of the column containing the word to be written, to:
apply the bits complementary to the bits to be written to the second conductive tracks of the rows containing the word to be written; and simultaneously apply a second binary value writing signal to the first conductive track of the column containing the word to be written.

5. The memory circuit of claim 1, wherein each elementary cell further comprises:
a second node for storing a data bit complementary to the bit stored on the first storage node of the cell;
a fourth transistor coupling the second storage node to a fifth conductive track and having its gate coupled to the second conductive track; and
fifth and sixth transistors series-coupled between a second node of application of a reference potential and a sixth conductive track, the gate of the fifth transistor being coupled to the second storage node (BLFI) and the gate of the sixth transistor being coupled to a seventh conductive track,
wherein the elementary cells of a same row share a same sixth conductive track and the cells of a same column share a same fifth conductive track and a same seventh conductive track.

6. The memory circuit of claim 5, wherein, in each elementary cell, the third and sixth conductive tracks are combined.

7. The memory circuit of claim 5, wherein, in each elementary cell, the third and sixth conductive tracks are distinct.

8. The memory circuit of claim 7, wherein the control circuit is configured, on implementation of a logic operation with a plurality of operands stored in different columns, to:
simultaneously apply, to the fourth conductive tracks of the columns containing the operands, a signal for controlling the third transistor to an on state and, to the seventh conductive tracks of the columns containing the operands, a signal for controlling the sixth transistor to an on state; and
read from the third conductive tracks of the rows containing the operands the bits of the result of the logic operation, and read from the sixth conductive tracks of the rows containing the operands the bits of the result of the complemented logic operation.

9. A memory circuit comprising a plurality of elementary cells arranged in an array of rows and columns and a control circuit,
wherein each elementary cell comprises:
a first data bit storage node;
a first transistor coupling the first storage node to a first conductive track and having its gate coupled to a second conductive track; and
a second and a third transistor series-coupled between a first node of application of a reference potential and a third conductive track, the gate of the second transistor being coupled to the first storage node and the gate of the third transistor being coupled to a fourth conductive track,
wherein the elementary cells of a same row share a same second conductive track and a same third conductive track and the cells of a same column share a same first conductive track and a same fourth conductive track,
wherein the control circuit is configured to implement an operation of vertical reading of a word from a column of the array, comprising:
applying, to the fourth conductive track of the column containing the word to be read, a signal for controlling the third transistor to an on state; and
reading the bits of the word from the third conductive tracks of the rows containing the word to be read;
wherein each elementary cell further comprises a seventh transistor coupling the first storage node to an eighth conductive track and having its gate coupled to a ninth conductive track and wherein the elementary cells of a same row share a same ninth conductive track and the elementary cells of a same column share a same eighth conductive track.

10. The memory circuit of claim 9, wherein the control circuit is configured, on implementation of an operation of vertical writing of a word into a column of the array, to:
apply the bits to be written to the second conductive tracks of the rows containing the word to be written and apply the bits complementary to the bits to be written to the ninth conductive tracks of the rows containing the word to be written; and simultaneously apply a first binary value writing signal to the first conductive track of the column containing the word to be written and a second binary value writing signal to the eighth conductive track of the column containing the word to be written.

* * * * *